United States Patent [19]

Yamazaki et al.

[11] Patent Number: 5,003,540
[45] Date of Patent: Mar. 26, 1991

[54] ERROR CORRECTION CODING AND DECODING CIRCUIT FOR DIGITALLY CODED INFORMATION

[75] Inventors: Koichi Yamazaki, Sakao; Yasuyuki Kimura, Kawagoe; Osamu Yamada, Hino; Toru Kuroda, Yokohama, all of Japan

[73] Assignees: Kabushiki Kaisha Nippon Coinco; Nippon Hoso Kyokai, both of Tokyo, Japan

[21] Appl. No.: 238,838

[22] Filed: Aug. 31, 1988

[30] Foreign Application Priority Data

Sep. 1, 1987 [JP] Japan ................................. 62-218738

[51] Int. Cl.⁵ ............................................ G06F 11/10
[52] U.S. Cl. .................................................. 371/37.9
[58] Field of Search ..................... 371/37.9, 38.1, 39.1, 371/41, 37.1

[56] References Cited

U.S. PATENT DOCUMENTS

| 3,587,042 | 6/1971 | Mitchell | 371/37.9 |
| 4,630,271 | 12/1986 | Yamada | 371/37.9 |
| 4,672,612 | 6/1987 | Shishikura | 371/37.9 |
| 4,675,868 | 6/1987 | Shishikura | 371/37.9 |
| 4,701,914 | 10/1987 | Matsushita | 371/13 |

Primary Examiner—Jerry Smith
Assistant Examiner—Robert W. Beausoliel
Attorney, Agent, or Firm—Koda and Androlia

[57] ABSTRACT

An error correction coding and decoding circuit for digitally coded information in which a majority difference set cyclic code is used to apply error correction coding and decoding to a data signal having data bits suitably assigned to information bits and parity bits, characterized in that a clock signal (CLKC) for the internal operation of the circuit, a data load clock signal for loading data onto the circuit, and a data read clock signal for reading data from the circuit are delivered from an external circuit provided separately from the error correction coding and decoding circuit.

3 Claims, 2 Drawing Sheets

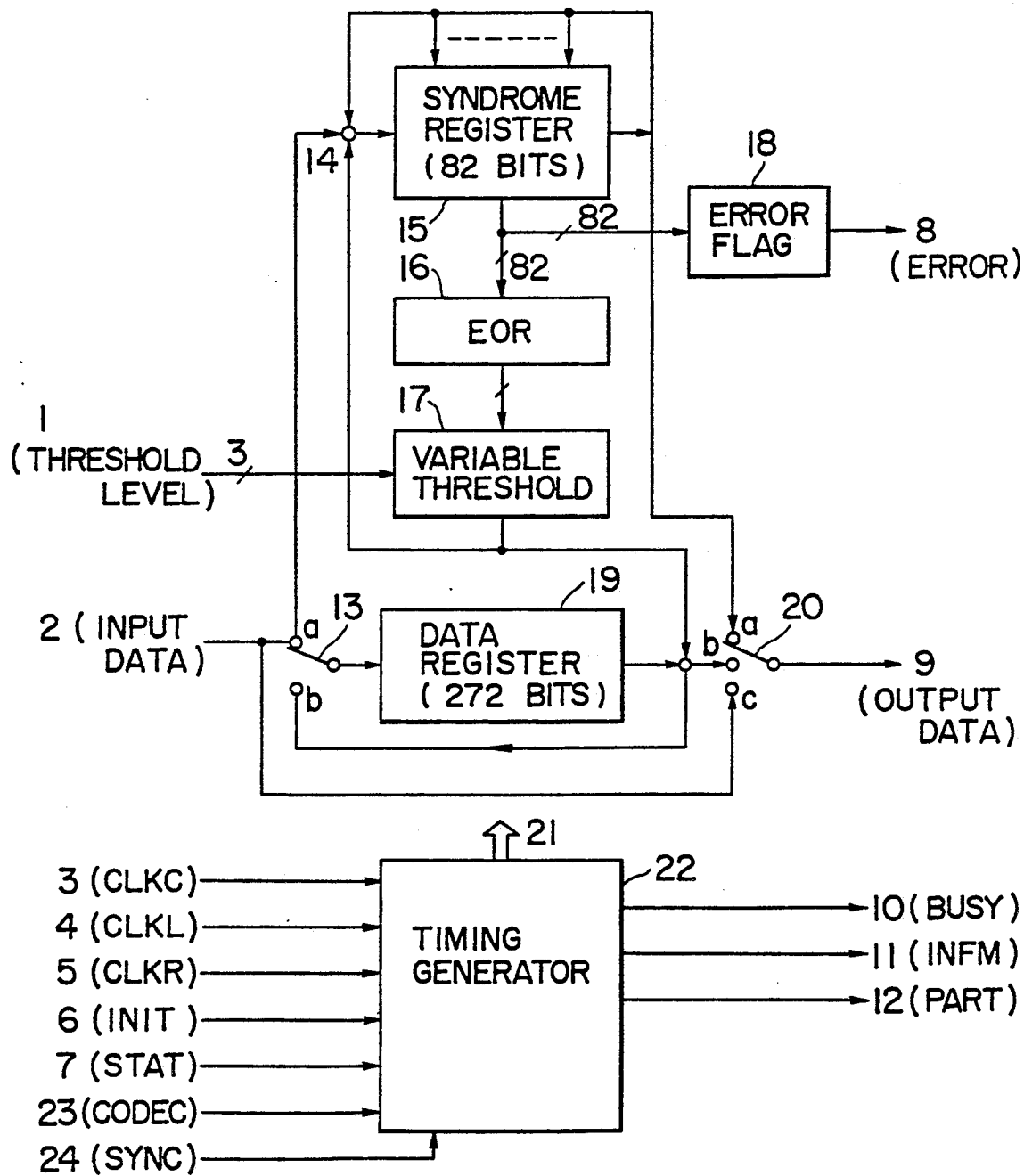
F I G. 1

ERROR CORRECTION CODING AND DECODING CIRCUIT FOR DIGITALLY CODED INFORMATION

BACKGROUND OF THE INVENTION

1. Field of the Art

This invention relates to an error correction coding and decoding circuit for digitally coded character information or graphic information, etc., and more particularly, to the configuration of an error correcting circuit for codes which can be decoded by hard logic, i.e., majority-logic elements.

2. Prior Art

In the prior art, as shown in Japanese Patent Application Laid-Open Nos. 133751/84, 181841/84 and 216388/84, most error correcting coding and decoding circuits of this kind become operative after initialization by program through the CPU. In this instance, a single clock signal is used and therefore the delay in the error correcting circuit is large. For serial data, a system was adopted to use two or more error correcting circuits of the same construction, to load data alternately.

In addition, the encoding circuit has no control signal to and from an external circuit, making such a circuit difficult to use as regards timing, etc.

Conventional error correction decoding circuits have a system to connect to a CPU to set initial and other conditions by program. Thus, they were difficult to use in a circuit comprised of only hard logic elements without a CPU.

SUMMARY OF THE INVENTION

This invention has been realized after consideration of the above-mentioned problems and has an object of providing an error correction coding and decoding circuit comprised of hard logic elements and capable of correcting errors independently of the program.

To achieve the above object, this invention provides an error correction coding and decoding circuit in which majority difference set cyclic codes are used to apply error correction coding and decoding to a data signal having data bits suitably assigned to information bits and parity bits, characterized in that a clock signal (CLKC) for the internal operation of circuit, a data load clock signal (CLKL) for loading data onto the circuit, a data read clock signal (CLKR) for reading data from the circuit, are delivered from an external circuit provided separately.

A high speed clock signal (CLKC) for the internal operation of the circuit, a clock signal (CLKL) for loading data, and a clock signal for reading data (CLKR) are delivered from an external circuit to an error correction coding and decoding circuit. These signals are delivered in the order of high speed clock signal (CLKC), data load clock signal (CLKL) and data read clock signal (CLKR). One cycle correction is made while lowering the threshold value in sequence by high speed clock signal (CLKC) to correct errors.

When error correction is completed, data load clock signal (CLKL) and data read clock signal (CLKR) perform data load and data read respectively, and at different timing.

The operations mentioned above can be performed by various circuits and their interfaces without using a program-operative CPU.

BRIEF DESCRIPTION OF THE DRAWINGS

In the accompanying drawings:

FIG. 1 is a circuit diagram showing an embodiment of this invention;

DESCRIPTION OF THE PREFERRED EMBODIMENT

Figure 2:
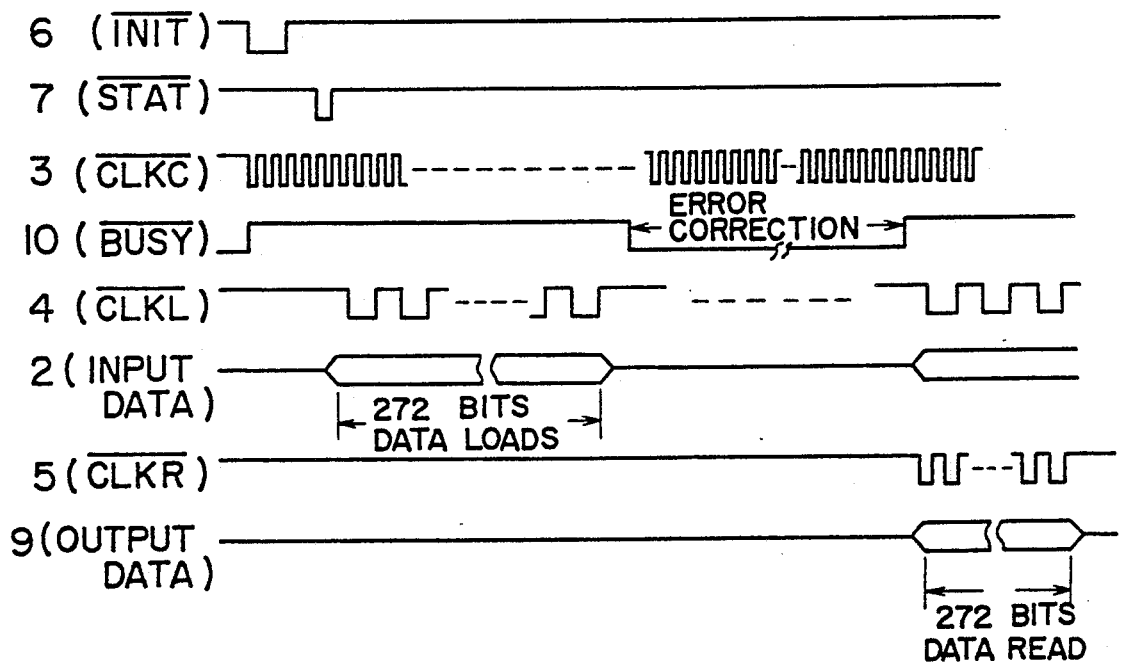
FIG. 2 is a timing chart showing the operation of the circuit shown in FIG. 1.

FIG. 1 shows an arrangement of a circuit using code (272, 190) according to this invention. Reference numeral 1 denotes a control signal (THRESHOLD LEVEL) to designate an initial threshold level for varying the threshold level of a majority circuit in order to enhance the error correcting ability of code (272, 190) as shown in Japanese Patent Application Laid-Open No. 181841/84. Namely, when bit pattern "000" is assumed as "9", designation up to "16" represented by bit pattern "111" can be continuously made. Reference numeral 2 denotes an input data (INPUT DATA), which is data of 272 bits at the time of error correction and data of 190 bits at the coding time. It is to be noted that these data are input simultaneously with clock signal (CLKL) 4.

Clock signal (CLKC) 3 is a signal for the internal operation of the circuit. Operations having no connection with load of data and read of data are all performed at the timing of this signal. Clock signal 4 is a clock signal for data load, clock signal 5 is a clock signal for data read, INIT signal 6 is a reset signal used when the power supply is turned on, etc., START signal 7 is a control signal for designating beginning of error correction and beginning of encoding, ERROR signal 8 is an error flag signal indicating whether or not all bits of an 82 bit syndrome register 15 are "0" at the same time as that when the correcting operation is completed, output data (OUTPUT DATA) signal 9 is data after error correction or data after encoding, BUSY signal 10 is a signal indicating whether or not data load is possible, INFM signal 11 corresponds to a time period of 190 bits of the information section of the output data signal 9, and PART signal 12 corresponds to a time period of 82 bits. Furthermore, reference numeral 13 denotes a switch for switching an output to data register, reference numeral 14 a modulo 2 one bit adder, reference numeral 15 an 82 bit syndrome register, reference numeral 16 an exclusive OR (EOR) circuit for generating a parity sum matrix, reference numeral 17 a variable threshold circuit, reference numeral 18 an error flag circuit, reference numeral 19 a 272 bit data register, and reference numeral 20 a switch for switching output data. In addition, reference numeral 21 denotes various clock signals and control signals for allowing the circuit of this invention to be operative, and reference numeral 22 a timing generator. In addition, CODEC signal 23 shows a control signal for designating whether the circuit of this invention is used as an encoding circuit or an error correcting circuit, and SYNC signal 24 a control signal for designating whether or not data after correction is always output at a fixed timing.

Operation of the Embodiment (A) The operation when the circuit of this invention is used as an error correcting circuit will be described first. An initial threshold level setting signal 1 is given.

It is known that when the initial threshold level by the setting signal is "12" or more, substantially fixed correcting performance is obtained. Accordingly, assuming that the initial threshold level is set to "12", it is sufficient to allow initial threshold level setting signal 1 to be expressed as "011". Thus, error corrections will be made four times (four cycles) at the maximum.

FIG. 2 shows the relationship of several timings in the above-mentioned signals, during operation as an error correcting circuit.

When the circuit is powered, INIT signal 6 is of course input to timing generator 22. Thus, all circuit components are reset by reset signal 21 from timing generator 22 to stand by subsequent operations. CLKC signal 3 is a high speed clock signal and the circuit is operated all by this clock signal after data load.

Then, signal 7 indicating the beginning of data load is input to STAT terminal so as to effect resetting of syndrome register 15, loading an initial threshold level onto variable threshold circuit 17, switching switch 13 to the side a, switching switch 20 to the side b, and like operations. It is to be noted that this STAT signal 7 should be given after it is confirmed that BUSY signal 10 which is an output of timing generator 22 has been output. When there is an indication of BUSY, i.e., BUSY signal 10 is at low level, the internal correcting circuit is still being operated, so that STAT signal 7 cannot be given. There is employed a circuit configuration which does not become operative, even if that signal is given.

After STAT signal 7 is input, when input signal 2 synchronous with clock signal (CLKL) 4 is given, data 2 of 272 bits is loaded onto data register 19 and syndrome register 15 at a timing of the clock signal (CLKL) 4. Since syndrome register 15 is a dividing circuit with feedback, if there is an error in an input signal except for overlooking error, the value after data of 272 bits is loaded should indicate a specific value which is not "0". Since various timings of data load may be assumed according to application, even if clock signal (CLKL) 4 has a toothless waveform, there is no problem if input data 2 is input to correspond with such a waveform.

After data of 272 bits are input, switch 13 is switched to the terminal b thereafter to initiate error correcting operation. As a result, the circuit is operated by clock signal (CLKC) 3. In this case, one bit of the first is such that it shifts only the syndrome register 15 by one bit. This is because code (272, 190) is originally a code obtained by shortening code (273, 191) by one bit.

By high speed clock signal (CLKC) 3, one cycle correction is made at the threshold level of "12". If error flag 18 at this time indicates an error (ERROR signal 8), one cycle correction is further made at the threshold level of "11". Until ERROR signal 8 is cleared, or correction in the case of the threshold level of "9" is completed, error correction will be made. During error correction operation, switch 13 should be switched to the side b and BUSY signal 10 should be at low level to indicate BUSY.

At the time when error correction is completed, BUSY signal 10 shifts to high level to indicate READY. When BUSY signal 10 indicates READY as a result of examination of that signal, a signal for data read is input to CLKR 5 to change over switch 20 to the side of the terminal b, thus making it possible to output error-corrected data of 272 bits as output data signal 9 at that timing.

In this case, when clock signals (CLKL) 4 and (CLKR) 5 are caused to be operative so that the timing for data load of CLKL 4 and the timing for data read of CLKR 5 are different in phase, and data read clock signal (CLKR) 5 is set to have a speed faster than that of data load clock signal (CLKL) 4, both clock signals (CLKL) 4 and (CLKR) 5 can be given at the same time. Namely, where BUSY signal 10 is at high level to indicate READY, data load is possible at all times.

It is to be noted that it is required to examine ERROR signal 8 (not shown in FIG. 2) immediately before data read. Furthermore, for standing by loading of data, switch 13 is required to be switched to the side a for a second time at the time of data read.

In addition, where SYNC signal (not shown in FIG. 2) is active, because it is desired to read data at exactly the same timing delay after completion of data load, even if ERROR signal 8 becomes "0" in the middle of error correction, it is sufficient to make a correction up to the final threshold level of "9". In such a mode, data after correction will be obtained at the same timing of four-cycle delay.

Figure 3:
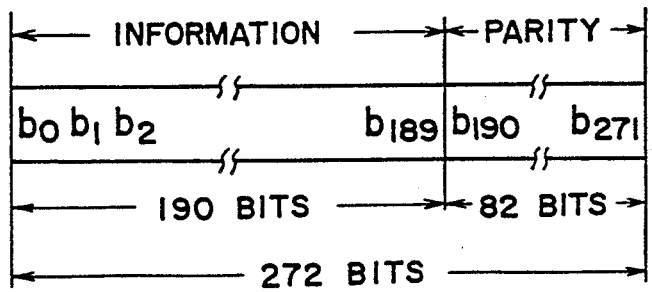
FIG. 3 is a view showing a bit transmission procedure of code (272, 190).

(B) The case where the circuit functions as an encoding circuit will be now described. In this case, CODEC signal 23 designates the encoding circuit. FIG. 3 shows the bit arrangement of code (272, 190). As a transmission signal, information bits of 190 bits are first transmitted and parity bits of 82 bits are then transmitted. Syndrome register 15 is cleared by STAT signal 7. Thus, input data signal 2 of 190 bits synchronous with the timing of the clock signal (CLKL) 4 for data load is loaded onto data register 19 and is also loaded onto syndrome register 15. At this time, switch 13 should be switched to side a and switch 20 should be switched to side b.

When all data input corresponding to 190 bits have been completed, output data signal 9 is output at a timing of clock signal (CLKR) 5 for data read. Namely, 190 bits in the data register 19 are output in sequence. On the other hand, the syndrome register 15 further carries out a cyclic shift corresponding to 82 bits to determine complete remainder of the dividing circuit. This serves as parity bits.

Accordingly, after 190-bit data is output, switch 20 is switched to side a, thus to successively output parities of 82 bits. In such a case, INFM 11 becomes active when 190-bit data is output, and PART 12 becomes active when 82-bit data is output.

It is assumed that INFM signal 11 and PART signal 12 output signals similar to the above also at the time of error correction.

While code (272, 190) has been described in the above-mentioned embodiment, this invention may be of course applicable to other various error correcting circuits.

Furthermore, while it has been described that correction clock signal (CLKC), data load clock signal (CLKL), and data read clock signal (CLKR) have frequencies completely different from each other, they may of course have the same frequencies. In addition, while it has been described that CLKL and CLKR are signals having been already subjected to gating, when a scheme is employed to input these signals as a continuous signal similar to CLKC to apply gating to them in the internal of the circuit by an external control signal, the same effects and advantages may be obtained.

Conventional circuits were devised on the premise that a program-operative CPU is used. In contrast, this invention has easily realized various circuits and interfaces without the use of such a CPU. In addition, partially simultaneous processing of data load and data read has become possible at the time of error correction.

(a) A scheme was adopted to permit clock signals for the internal operation of the circuit, clock signals at the time of loading data signal, and clock signals for reading data after correction to be independently input, and to indicate the information bit period and the parity bit period at the time of data read. Furthermore, a scheme was adopted to permit data after correction to be always read out at the same timing delay by designation of mode. Furthermore, a scheme was adopted to permit data load and data read to be conducted simultaneously. In addition, a scheme was adopted to output signals indicative of information section and parity section also at the time of coding.

(b) Three kinds of clock signals can be independently designated. Particularly, because it is possible to execute high speed processing at the time of correction, the processing speed can be improved as a whole. Since there are signals indicative of information section and parity section, it is easy to provide an interface with other circuits.

(c) Since the circuit of this invention can be constituted without using a CPU, it is not required to be large and can be widely used. In addition, the circuit is readily implemented as IC.

What is claimed is:

1. An error correction coding and decoding circuit for digitally coded information comprising:

data register for loading data, having information signal of a first predetermined bit number and parity signal of a second predetermined bit number, in response to a data-load clock CLKL, and for reading out corrected data therefrom in response to a data-read clock CLKR;

syndrome register for loading the parity signal of the data in response to the data-load clock after resetting said syndrome register at the commencement of data loading, and then reading out the same in response to a high-speed correction clock;

first switch, provided at the input side of said data register, for switching from a mode for inputting data from a data source to said data register to a mode for cyclically inputting the output of said data register to the input of said data register vice versa;

second switch for selectively deriving the output of said syndrome register and the output of said data register; and error correction circuit having EOR circuit for judging whether the parity signal from said syndrome register is correct in response to the high-speed correction clock using a majority difference set cyclic code, error flag circuit for detecting error included in the output of said syndrome register to output ERROR signal, and variable threshold circuit for outputting an error correction signal to said syndrome register and said data register, when the output of said syndrome register includes an error, until correction, based upon the output of said EOR circuit as to predetermined thresholds, has finished;

timing generator to which clock signal including both the high-speed correction clock and the data load-clock, data load start signal STAT, correction mode indicating signal CODEC and synchronous signal SYNC being applied as input signals, so as to output a signal BUSY indicating that said error correction circuit is under error correction operation based upon the signal CODEC and to output a signal INFM indicating that the information signal of the data is being outputted and a signal PART indicating that the parity signal is being outputted following the information signal after said error correction circuit has finished error correction operation;

thereby to load data to said data register through said first switch so as to correct the data by said data register and said variable threshold circuit, and then output corrected data through said second switch.

2. A circuit of claim 1, wherein the speeds of the data read clock CLKR and the data load clock CLKL are slower than that of the high-speed correction clock, and the speed of the data read clock signal CLKR is faster than that of the data load clock signal.

3. A circuit of claim 1, wherein the error correction circuit is a circuit for processing coded signals.

* * * * *

UNITED STATES PATENT AND TRADEMARK OFFICE
CERTIFICATE OF CORRECTION

PATENT NO. : 5,003,540

DATED : March 26, 1991

INVENTOR(S) : Koichi Yamazaki, et al.

It is certified that error appears in the above-identified patent and that said Letters Patent is hereby corrected as shown below:

Title Page:
[73] Assignees: Change "Kabushiki Kaisha Nippon Coinco; Nippon Hoso Kyokai, both of Tokyo, Japan" to --Nippon Conlux Co., Ltd.; Nippon Hoso Kyokai, both of Tokyo, Japan--

Signed and Sealed this

Twenty-fifth Day of August, 1992

Attest:

DOUGLAS B. COMER

*Attesting Officer*  *Acting Commissioner of Patents and Trademarks*